(12) United States Patent
Tsukamoto (10) Patent No.: US 8,070,917 B2
(45) Date of Patent: Dec. 6, 2011

(54) REACTIVE SPUTTERING METHOD (75) Inventor: Naoki Tsukamoto, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 400 days.

(21) Appl. No.: 12/332,808

(22) Filed: Dec. 11, 2008

(65) Prior Publication Data

US 2009/0159429 A1 Jun. 25, 2009

(30) Foreign Application Priority Data

Dec. 13, 2007 (JP) .................................. 2007-321611

(51) Int. Cl.
*C23C 14/35* (2006.01)
*C23C 14/06* (2006.01)
*C23C 14/50* (2006.01)
*C23C 14/54* (2006.01)

(52) U.S. Cl. ......... 204/192.12; 204/192.13; 204/192.14; 204/192.15

(58) Field of Classification Search ............. 204/192.12, 204/192.15
See application file for complete search history.

(56) References Cited

U.S. PATENT DOCUMENTS

| | | | | |
|---|---|---|---|---|
| 3,905,887 | A | * | 9/1975 | Kuehnle .................... 204/192.15 |
| 6,911,779 | B2 | * | 6/2005 | Madocks .................. 204/192.12 |
| 2009/0233101 | A1 | * | 9/2009 | Tsukamoto .............. 204/192.15 |

* cited by examiner

*Primary Examiner* — Mark F Huff
*Assistant Examiner* — John S Ruggles
(74) *Attorney, Agent, or Firm* — Birch, Stewart, Kolasch & Birch, LLP (57) ABSTRACT

A reactive sputtering method for application of a bias voltage to a supporting substrate in formation of a film of a metal compound on the supporting substrate according to a bias sputtering method; wherein a supporting substrate conveyor unit and a cathode that includes a target facing the supporting substrate conveyor unit are provided; the supporting substrate is conveyed between the supporting substrate conveyor unit and the target for formation of a film of a metal compound on the supporting substrate; magnets are provided adjacent to the supporting substrate conveyor unit on a side thereof opposite to that of the supporting substrate, such that a magnetic field is closed and a continuing tunnel part of parallel or nearly parallel arched magnetic force lines forms an oval or a polygon on the supporting substrate, the magnets each having a first magnetic pole of an S pole or an N pole and a second magnetic pole opposite to the first magnetic pole, the second magnetic pole surrounding the first magnetic pole; and in film formation on the supporting substrate, the magnets are rotated inside a drum in an opposite direction to that in which the supporting substrate is conveyed outside of the drum, so as to secure uniform plasma application along the supporting substrate.

9 Claims, 5 Drawing Sheets

REACTIVE SPUTTERING METHOD

TECHNICAL FIELD

The present invention relates to a bias sputtering method for film formation through reactive sputtering with a metal compound, in which a bias is applied to the supporting substrate, and to magnet arrangement on the back of the supporting substrate when a film of a metal compound continuously formed on the supporting substrate.

BACKGROUND ART

For sputtering with a target, there is known a method of film formation with a metal compound which comprises introducing a reactive gas followed by reacting the reactive gas with a metal (reactive sputtering method). This method is characterized in that, in general, Al, Si or the like is used as the target, a rare gas such as He or Ar is used as the process gas, and $O_2$, $N_2$ or the like is used as the reactive gas; and that the target is reacted with the reactive gas and, as a result, a metal compound is formed on a substrate.

For high-speed film formation according to conventional reactive sputtering, employed is a method of controlling the reactive gas flow rate by monitoring the plasma emission intensity, the voltage and the inner pressure followed by feeding the data back to the mass flow controller (see U.S. Pat. No. 4,166,784). In this method, however, in case where the film formation speed greatly differs between metal and metal compound such as Al and $Al_2O_3$ and when a metal compound having a sufficient stoichiometric ratio is formed into a film through reactive sputtering, then there may occur a problem in that the film formation speed of the metal compound is relatively low as compared with the film formation speed of the metal alone.

As another method, there is known a substrate bias method which comprises applying a bias to a substrate to promote the reaction of a reactive gas and a metal on the substrate when a film of a metal compound is formed on a substrate (e.g., JP-A 4-154963). In this method, the film formation speed is high since the film formation is carried for a metal; in this, however, the film formed is re-etched on the substrate, therefore causing a problem in that the film surface may be roughened and the film density may lower.

In addition, also known is a modification of the substrate bias method, in which magnets are provided on the back of the substrate to lower the discharge voltage thereby to prevent the formed film from being re-etched, and the modified method satisfies both the film damage reduction and the high-speed film formation (JP-A 58-133376). However, in the method described in JP-A 58-133376, magnets are so provided to the carousel-type substrate holder that they may generate a magnetic field in the direction parallel to the rotary axis direction of the carousel, and therefore, electrons rotate on the periphery of the carousel. Accordingly, in this, when the electrons are not discharged on the entire periphery, the electrons may be shifted and the efficiency may worsen. Therefore, in the method, the discharging must occur in every site on the carousel periphery, and continuous film formation that requires substrate change is impossible.

One reason for lowering most the production speed in film production in a mode of vacuum film formation is that vacuum breaking and degassing into vacuum takes too much time. To solve the problem and to improve the producibility, continuous film formation such as roll-to-roll film formation not requiring vacuum breaking is desired, and a sputtering apparatus is desired, which may be driven at a high film formation speed and may secure continuous film formation with less damage to the formed film.

Figure 4:
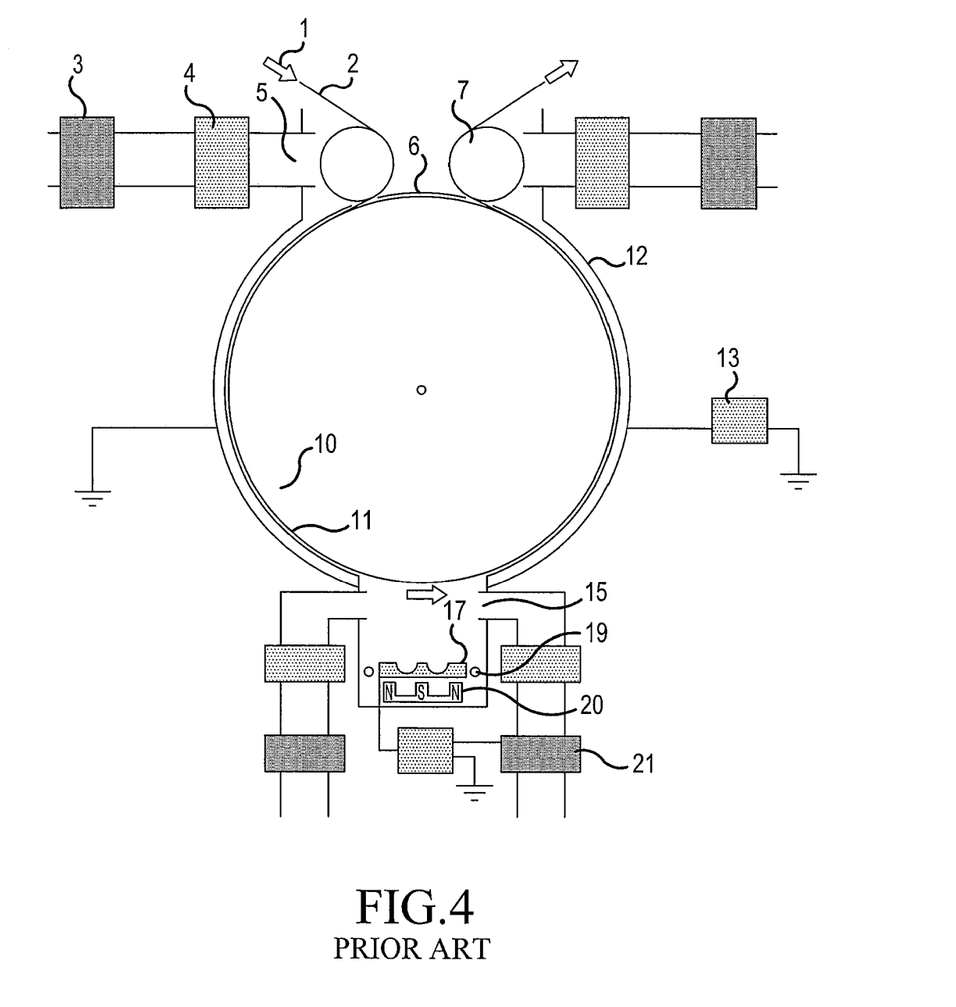
FIG. 4 is a schematic view showing an example of a conventional reactive sputtering apparatus.

A conventional reactive sputtering apparatus is described with reference to FIG. 4. In FIG. 4, 1 is the traveling direction of a supporting substrate, 2 is the supporting substrate, 3 is a rotary pump, 4 is a turbomolecular pump, 5 is a vent, 6 is an earth shield, 7 is a pass roll, 10 is cooling water, 11 is a drum, 12 is a chamber, 13 is an RF power source for matching box and drum, 15 is a vent, 17 is a target, 19 is a process gas and reactive gas introduction port, 20 is a magnet for target provided on a cathode, 21 is an RF power source for matching box and target (the same shall apply also to FIGS. 1, 5 and 6).

In the reactive sputtering apparatus, a continuous film is used as the supporting substrate, and the continuous film is conveyed with the drum. From the RF power source 13 for matching box and drum, a power is applied to the supporting substrate 2 for film formation thereon, whereby the reactive gas is changed to a plasma state and led on the supporting substrate, therefore promoting the reaction with the metal sputtered from the target 17 to form a thin film of a metal compound on the supporting substrate 2. However, this apparatus could not evade the above-mentioned prior-art problems.

SUMMARY OF THE INVENTION

Problems that the Invention is to Solve

The invention relates to a sputtering apparatus for continuous film formation, in which the damage to the film formed is minimized even at a high film formation speed.

To solve the above problems, the invention provides the following:

(1) A reactive sputtering apparatus for a bias sputtering method of applying a bias voltage to a supporting substrate in formation of a film of a metal compound on the supporting substrate according to a reactive sputtering method;

which comprises a supporting substrate conveyor unit and a cathode that includes a target provided to face the supporting substrate conveyor unit, and wherein a supporting substrate is conveyed between the supporting substrate conveyor unit and the target for formation of a metal compound on the supporting substrate, magnets are provided adjacent to the supporting substrate conveyor unit on the side thereof opposite to the supporting substrate in such that the magnetic field is closed and the continuing tunnel part of parallel or nearly parallel arched magnetic force lines forms an oval or a polygon, on the supporting substrate, the magnets each having a first magnetic pole of an S pole or an N pole and a second magnetic pole opposite to the first magnetic pole, the second magnetic pole surrounding the first magnetic pole and, in film formation on the supporting substrate, the supporting substrate is conveyed on the same plane as that of the tunnel part and in the direction nearly perpendicular to the tunnel part.

(2) The reactive sputtering apparatus of (1);
wherein a process gas is introduced thereinto from around the target and a reactive gas is introduced from around the supporting substrate.

(3) The reactive sputtering apparatus of (2);
wherein the process gas is a rare gas.

(4) The reactive sputtering apparatus of (2) or (3);
wherein the reactive gas is oxygen, nitrogen, methane or water.

(5) The reactive sputtering apparatus of any one of (1) to (4);

wherein the target is surrounded with an earthed rectangular metal plate box and the plate between the target and the supporting substrate and parallel to them is mesh.

(6) The reactive sputtering apparatus of (5);
wherein the mesh has the degree of opening of at least 50%.
(7) The reactive sputtering apparatus of any one of (2) to (6);
wherein the data of the reactive gas flow rate are fed back to the system for automatic control to secure constant discharge voltage, plasma emission intensity or inner pressure.
(8) The reactive sputtering apparatus of any one of (1) to (7);
wherein the supporting substrate conveyor unit is driven according to a roll-to-roll system with a drum.
(9) The reactive sputtering apparatus of any one of (1) to (8);
wherein the target material is one or more selected from the group consisting of Mg, Al, Si, Ti, Zn, W, Mo, Ge and Sb.
(10) The reactive sputtering apparatus of any one of (1) to (9);
wherein the supporting substrate is any of Si wafers, glass substrate and resin substrates.
(11) A reactive sputtering method for application of a bias voltage to a supporting substrate in formation of a film of a metal compound on the supporting substrate according to a bias sputtering method;
wherein a supporting substrate conveyor unit and a cathode that includes a target provided to face the supporting substrate conveyor unit are provided, and a supporting substrate is conveyed between the supporting substrate conveyor unit and the target for formation of a film of a metal compound on the supporting substrate,
magnets are provided adjacent to the supporting substrate conveyor unit on the side thereof opposite to the supporting substrate in such that the magnetic field is closed and the continuing tunnel part of parallel or nearly parallel arched magnetic force lines forms an oval or a polygon, on the supporting substrate, the magnets each having a first magnetic pole of an S pole or an N pole and a second magnetic pole opposite to the first magnetic pole, the second magnetic pole surrounding the first magnetic pole and,
in film formation on the substrate, the magnets or the substrate are rotated or conveyed so as to secure uniform plasma application to the substrate.
(12) The reactive sputtering method of (11);
wherein a process gas is introduced thereinto from around the target and a reactive gas is introduced from around the supporting substrate.
(13) The reactive sputtering method of (12);
wherein the process gas is a rare gas and the reactive gas is oxygen, nitrogen, methane or water.
(14) The reactive sputtering method of any one of (11) to (13);
wherein the target is surrounded with an earthed rectangular metal plate box and the plate between the target and the supporting substrate and parallel to them is mesh.
(15) The reactive sputtering method of (14);
wherein the mesh has the degree of opening of at least 50%.
(16) The reactive sputtering method of any one of (12) to (15);
wherein the data of the reactive gas flow rate are fed back to the system for automatic control to secure constant discharge voltage, plasma emission intensity or inner pressure.
(17) The reactive sputtering method of any one of (11) to (16);
wherein the supporting substrate conveyor unit is driven according to a roll-to-roll system with a drum.
(18) The reactive sputtering method of any one of (11) to (17);
wherein the target material is one or more selected from the group consisting of Mg, Al, Si, Ti, Zn, W, Mo, Ge and Sb.
(19) The reactive sputtering method of any one of (11) to (18);
wherein the supporting substrate is any of Si wafers, glass substrate and resin substrates.

DESCRIPTION OF SPECIFIC EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

The sputtering apparatus of the invention comprises a supporting substrate conveyor unit and a cathode that includes a target provided to face the supporting substrate conveyor unit, and is characterized in that a film of a metal compound is formed on a supporting substrate conveyed between the supporting substrate conveyor unit and the target, that magnets each having a first magnetic pole of an S pole or an N pole and a second magnetic pole opposite to the first magnetic pole and surrounding to the first pole are provided adjacent to the supporting substrate conveyor unit on the side thereof opposite to the supporting substrate in such that the magnetic field is closed and the continuing tunnel part of parallel or nearly parallel arched magnetic force lines forms an oval or a polygon, on the supporting substrate, and that, when the film is formed on the supporting substrate, the supporting substrate is conveyed on the same plane as that of the tunnel part and in the direction nearly perpendicular to the tunnel part.

A preferred embodiment of the invention is described below with reference to FIG. 1 to FIG. 3, to which, however, the invention should not be limited.

In the apparatus of the invention, the supporting substrate conveying method to be employed may be any one that enables continuous production with no limitation. A method of conveying the substrate by supporting both ends of the substrate with plural rollers and rotating the rollers, and a method of fitting the supporting substrate to a supporting substrate holder and conveying the supporting substrate along with the substrate holder may be taken into consideration. Preferred is a roll-to-roll system using a drum as in FIG. 1. The roll-to-roll system using a drum is described below.

Figure 3:
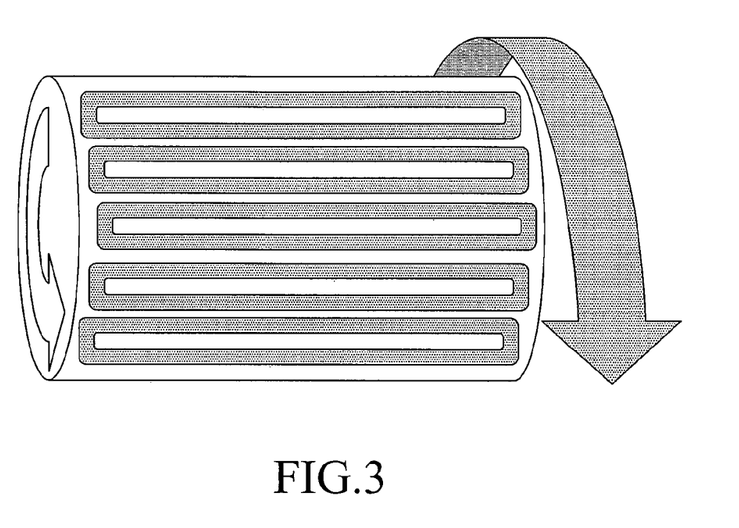
FIG. 3 is a schematic view showing a preferred positional relationship between the drum and the magnet for drum in FIG. 1.

In case where magnets for drum are provided on a drum as in FIG. 3, it is preferred so planned that the electrons closed in the magnetic field of the drum may move but in the area where the electron discharging is unnecessary, an earthed metal plate is provided as spaced from the drum by at most 2 mm to prevent the discharging. Also preferably, the pressure is at most 0.001 Pa in the conveyance part for preventing discharging in the other area than the film formation chamber. More preferably, the drum has a double-layered structure and is so planned that the rotation of the drum surface to be kept in contact with the film and that of the magnet inside the drum can be independently controlled. The drum of the type enables more uniform film formation.

Figure 1:
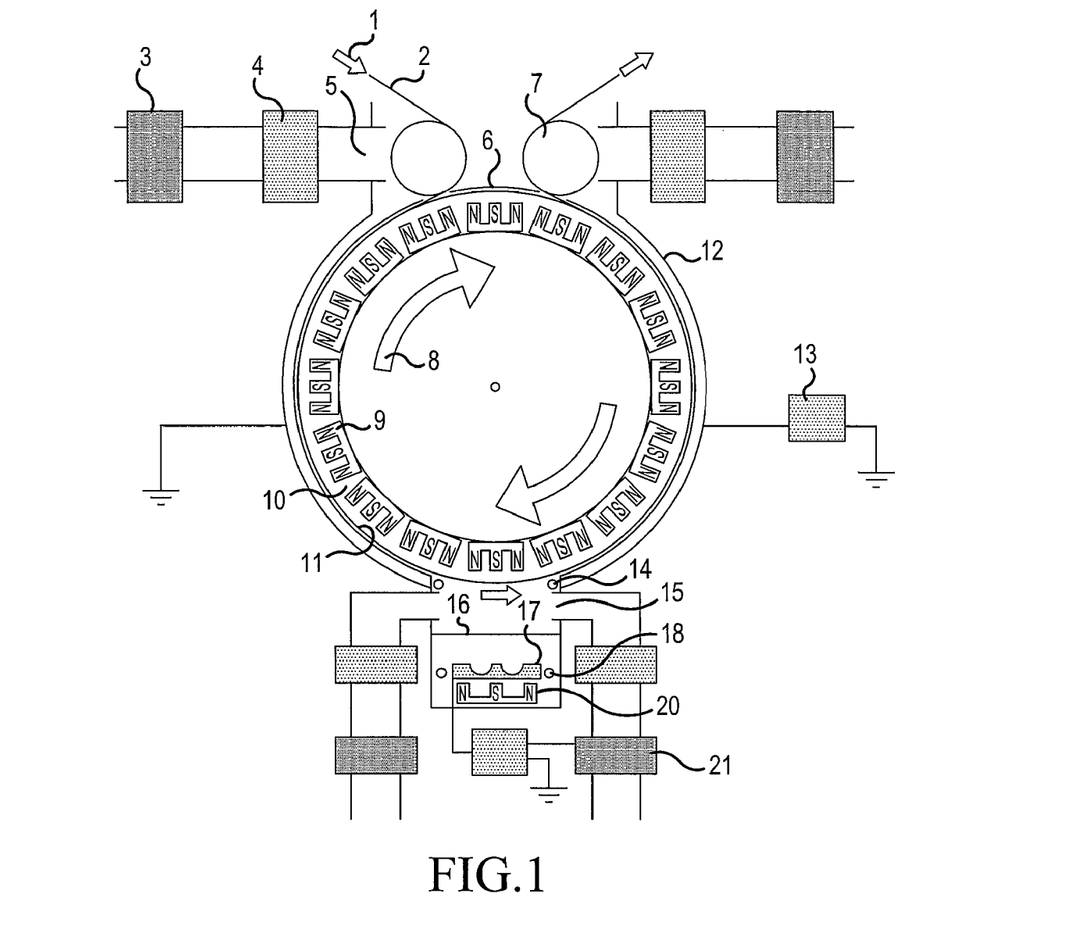
FIG. 1 is a schematic view showing a first example of the reactive sputtering apparatus of the invention.

In the invention, for example, as in FIG. 1, a power is applied to the supporting substrate 2 for film formation thereon, from the RF power source 13 for matching box and drum, whereby the reactive gas is changed to a plasma state, and then this is reacted with the target 17 to form a thin film of a metal compound on the supporting substrate 2. In this, a magnet for drum 9 is provided on the side of the supporting substrate conveyor unit opposite to the supporting substrate. The cathode in this means the region that includes the power source RF 21 for matching box and target, and the target 17.

Figure 2:
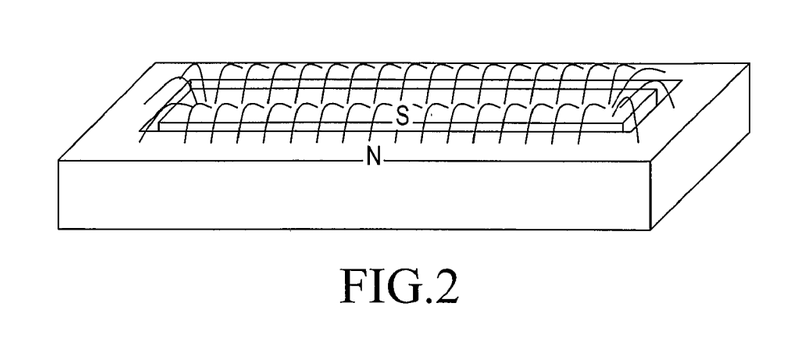
FIG. 2 is a schematic view showing the magnet for drum in FIG. 1.

FIG. 2 shows one example of the magnet 9 for drum, in which the magnetic force lines of the drum magnet 9 are such that the magnetic field is closed on the surface of the supporting substrate 2 (on the cathode side), and the continuing tunnel of the arched magnetic force lines forms an oval or a polygon and has parts parallel or nearly parallel to each other. The drum magnets each having a first magnetic pole of an S pole or an N pole and a second magnetic pole opposite to the first magnetic pole and surrounding the first magnetic pole are provided so as to form the magnetic force lines as above. Specifically, the magnet has a N pole surrounding a S pole, or has a S pole surrounding a N pole.

In this, the magnetic force line vertically going out of the N pole surface changes its direction while forming an oval, and vertically comes into the S pole surface, and therefore, the magnetic force line is arched. The wording "forming an oval or a polygon" as referred to herein is not limited to an oval or a polygon in the mathematical meaning, but is meant to include any others such as intermediate forms between oval and polygon and those having some deformation, within a range not overstepping the scope and the gist of the invention. The wording "parts parallel or nearly parallel to each other" means that, while the supporting substrate is conveyed, the total of the magnetic field that passes through a different point of the supporting substrate is almost uniform.

On the drum magnet 9, the supporting substrate 1 is conveyed in the direction of the narrow side of the magnet for film formation thereon.

Having the constitution as above, the plasma density on the supporting substrate may be high, and even though the bias power to the supporting substrate is increased for sufficient reaction between the target and the reactive gas, the bias may be lowered and the damage to the substrate may be reduced. Further, since the electrons may be closed on one magnet, and the substrate change is possible for continuous production.

Not specifically defined, the plasma generation power source for cathode for use in the apparatus of the invention may be any one for reactive sputtering, including an RF power source (at least 1 MHz), an MF power source (at most 1 MHz), a DC power source (having an arcing preventing function, preferably for pulsewise outputting), an AC power source, and superposition (combination) of a DC power source and an RF power source, etc.

In the cathode, used is a magnet 20 for target capable of producing a magnetic field that runs from the back (opposite side to the supporting substrate) of the target 17 and closes on the surface of the target (on the substrate side) to be in parallel to the target. Preferably, the target magnet 20 on the back of the cathode can control the intensity of the magnetic field on the target surface by changing the distance between the target 17 and the target magnet 20 in accordance with the amount of the target 17 to be used. Accordingly, the discharge state fluctuation in use of the target 17 can be reduced and the film formation speed may be thereby stabilized.

In the method of applying a substrate bias to the supporting substrate in the apparatus of the invention, the same power source as that for the target 17 for forming a metal compound film on the supporting substrate may be used.

The power source to be used in this may be the same as that used for the target, or may differ from the latter. In case where a power source having the same frequency is used, the phase must differ between the two.

Figure 5:
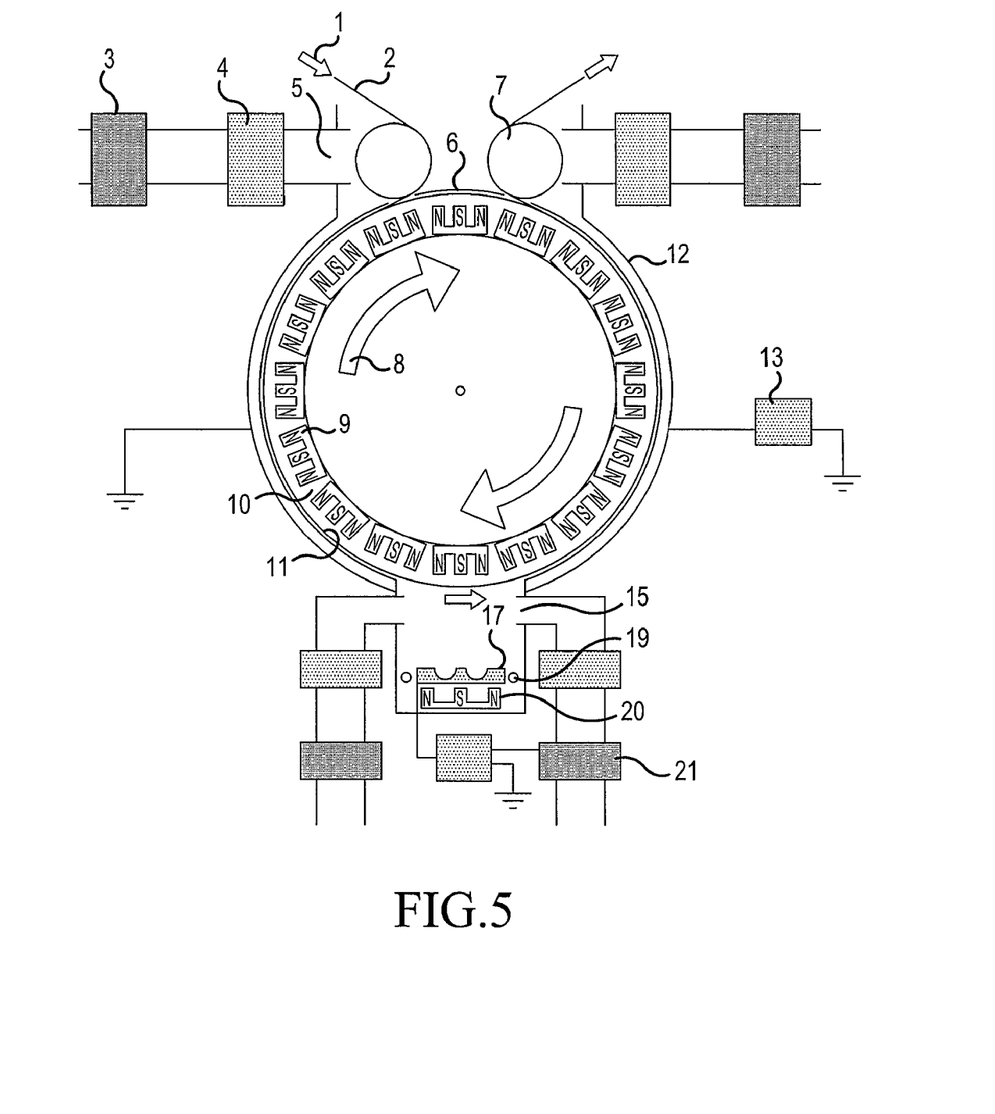
FIG. 5 is a schematic view showing a second example of the reactive sputtering apparatus of the invention.

For gas introduction, for example, as in FIG. 5, an introduction port 19 for process gas and reactive gas is formed, and process gas and reactive gas, as mixed together, may be introduced into the system. Preferably, for example, as in FIG. 6, a reactive gas introduction port 14 is formed near the supporting substrate, and a process gas introduction port 18 is formed near the target 20. In that manner, when a process gas is introduced from around the target and a reactive gas is from around the substrate, then the substrate may be first brought into contact with the reactive gas prior to the target, and this is advantageous in that the reaction between the sputtered metal and the reactive gas on the substrate may be promoted more. In this, the technique of "forming a reactive gas introduction port near the supporting substrate" means that the port is provided between the supporting substrate and the target but preferably nearer to the supporting substrate. The technique of "forming a process gas introduction port near the target" means that the port is provided between the supporting substrate and the target but preferably nearer to the target.

The process gas as referred to herein is one introduced into the system under the intention that it may assist easy plasma generation but not reacting with a metal, and in general, it is a rare gas (element of the Group 18, He, Ne, Ar, Kr, Xe).

The reactive gas introduction may be controlled by specifically monitoring the flow rate with a flow rate controller (mass flow meter). For this, preferably, the plasma process is monitored and its data are fed back to the mass flow meter for fine control of the flow rate, to thereby stabilize the process.

The method of data feedback is not specifically defined, for which, for example employable is any method of monitoring the inner pressure, the voltage and the plasma emission in the system.

In the apparatus of the invention, for example, as in FIG. 1, earthed mesh 16 is preferably provided between the target 17 and the supporting substrate 2. The degree of opening of the mesh, if any, is preferably at least 50%; but more preferably, the mesh has a pore-to-pore distance of at most 2 mm and its opening degree is at least 95%. Preferably, the mesh is in the form of a metal net or a punched metal sheet.

In the above film formation, the thickness of the film to be formed may be controlled in any desired manner by controlling the substrate conveying speed and the cathode power.

The film formation speed may differ depending on the power source, the power and the chamber form, but the sputtering degree is determined almost by the material used. Therefore, the film formation with a compound that may have a different film formation speed according to the control method employed may be compared with the film formation with a metal under the same power supplying condition, whereby the effect of increasing the film formation speed in the invention may be evaluated.

In the invention, the reactive gas is a gas that reacts with the target, and includes, for example, oxygen, nitrogen, methane and water.

In the invention, the target material may be any conductive material such as metal, semiconductor, etc. For example, it includes Mg, Al, Si, Ti, Zn, W, Mo, Ge, Sb, etc., preferably Mg, Al or Si, more preferably Al. An alloy of those metals as mixed in any desired manner is also usable as the target.

In the invention, the supporting substrate is generally a self-supporting substrate, and its material may be any of Si wafers, glass, resin substrates, etc. In film formation according to a roll-to-roll system, preferred are flexible resin substrates.

A plastic film for the resin substrate is described below.

The plastic film may be any of a thermoplastic polymer film of a thermosetting polymer film. Preferably, the single substance of the thermoplastic polymer has Tg of from 70° C. to 350° C., more preferably not lower than 120° C. The thermoplastic resin satisfying the requirement includes, for example, the following (the parenthesized value indicates Tg):

Polyethylene terephthalate (PET: 80° C.), polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC: compound described in JP-A 2001-150584: 162° C.), fluorene ring-modified polycarbonate (BCF-PC: compound described in JP-A 2000-227603: 225° C.), alicyclic-modified polycarbonate (IP-PC: compound described in JP-A 2000-227603: 205° C.), acryloyl compound (compound described in JP-A 2002-80616: 300° C. or higher) polyimide (Kapton: 300° C. or higher).

In case where the film requires transparency, preferred are alicyclic polyolefin, etc.

The thermosetting polymer includes an epoxy resin and a radiation-curable resin. The epoxy resin includes polyphenol-type, bisphenol-type, halogenobisphenol-type and novolak-type resins. The curing agent for curing the epoxy resin may be any known curing agent. For example, the curing agent includes amines, polyaminoamides, acids and acid anhydrides, imidazoles, mercaptans, phenolic resins, etc. Above all, preferred are acid anhydrides, and polymers or aliphatic amines having an acid anhydride structure from the viewpoint of the solvent resistance, the optical characteristics, thermal characteristics, etc. More preferred are acid anhydrides and polymers having an acid anhydride structure. Also preferably, a suitable amount of a curing catalyst such as known tertiary amines or imidazoles may be added.

The thickness of the plastic film is not specifically defined since it may be suitably selected depending on its use. Typically, the thickness is from 1 to 800 μm, preferably from 10 to 200 μm.

The plastic film may have an undercoat layer on one or both surfaces thereof. Examples of the undercoat layer are a transparent conductive layer, a primer layer, a mat agent layer, a protective layer, an antistatic layer, a planarizing layer, an adhesiveness-enhancing layer, a light-shielding layer, an antireflection layer, a hard coat layer, a stress relaxation layer, an antifogging layer, an anti-soiling layer, a printable layer, etc. Of such undercoat layers, preferred is a mat agent layer to be formed on one surface of the film.

In case where the plastic film is used in image display devices such as various displays, a transparent plastic film is preferably used. Concretely, preferred is a plastic film having a light transmittance of from 80% to 100%, more preferably at least 85%, even more preferably at least 90%.

Even in use in displays, the plastic film does not always require transparency in case where the film is not installed on the viewers' side; and when the film is used for non-transparent packaging materials, it does not also require transparency. In such cases, non-transparent materials may be used. The non-transparent materials include, for example, polyimide, polyacrylonitrile, known liquid-crystal polymer, etc.

In case where the apparatus of the invention is used for producing a barrier film having an extremely small water vapor permeability, the plastic film may have an organic layer on at least one surface thereof. The organic layer as referred to herein is preferably composed of a curable resin. The curable resin is a resin that may cure when irradiated with radiations such as UV rays or electron beams, and is concretely a resin having, in the molecule or the unit structure thereof, an unsaturated double bond such as an acryloyl group, a methacryloyl group or a vinyl group, or a polymerizing functional group such as an epoxy group. Of those, preferred is an acrylic resin having an acryloyl group. One or more different types of such radiation-curable resins may be used either singly or as combined; but preferred is an acrylic resin having at least two acryloyl group in the molecule or the unit structure thereof. The polyfunctional acrylate resin includes, for example, urethane acrylates, ester acrylates and epoxy acrylates, to which, however, the invention should not be limited.

The barrier film preferably has a barrier layer comprising plural organic layers and inorganic layers, formed on a plastic film, in which the order of laminating the barrier layers may be defined in any desired manner. The barrier layer may be formed only on one surface of the plastic film, or may be on both surfaces thereof. In case where the layer is formed on both surfaces of the film, the two barrier layers may be the same constitution or may have different constitutions.

In the apparatus of the invention, the magnet may be a permanent magnet or an electromagnet; however, from the viewpoint of the easiness in constructing the apparatus, preferred is a permanent magnet. As a permanent magnet, known are an alnico magnet, a ferrite magnet and a rare earth magnet (neodymium magnet, etc.). Magnets of the same type may be combined. Most preferred is a neodymium magnet from the viewpoint of the intensity of the magnetic force thereof.

The use of the thin film produced by the use of the apparatus of the invention is not specifically defined. In particular, the invention is especially effective in forming high-density thin films that are required to have little damage and have high producibility, such as high-barrier films (e.g., $Al_2O_3$ film), transparent conductive films (e.g., ITO film), compound semiconductors (e.g., IGZO film), thermochromics (e.g., $VO_2$ film), photocatalysts (e.g., $TiO_2$ film), optical thin films, etc.

EXAMPLES

The invention is described more concretely with reference to the following Examples, in which the material used, its amount and the ratio, the details of the treatment and the treatment process may be suitably modified or changed not overstepping the spirit and the scope of the invention. Accordingly, the invention should not be limited to the Examples mentioned below.

(Formation of Inorganic Film I1)

An apparatus of FIG. 4 was used. Al was used as the target. A process gas Ar was introduced through the introduction port 19 at 2.0 sccm, and a cathode power 1000 W was applied for plasma discharging. With the drum kept cooled and rotated, Al was deposited on a PEN film to be a thickness of 50 nm, thereby forming an inorganic film I1.

(Formation of Inorganic Film I2)

An apparatus of FIG. 4 was used. Al was used as the target. A process gas Ar was introduced through the introduction port 19 at 2.0 sccm, and a cathode power 1000 W was applied for plasma discharging. In this, the discharge voltage in the absence of a reactive gas $O_2$ was 100%, and the discharge voltage in the presence of the reactive gas at 10.0 sccm was 0%. The data were fed back to the mass flow controller so as to keep a discharge voltage of 30% under automatic control, and a reactive gas $O_2$ was introduced through the introduction port 19. With the drum kept cooled and rotated, $Al_2O_3$ was deposited on a PEN film to be a thickness of 50 nm, thereby forming an inorganic film I2.

(Formation of Inorganic Film I3)

An apparatus of FIG. 4 was used. Al was used as the target. A process gas Ar was introduced through the introduction port 19 at 2.0 sccm, and a cathode power 1000 W was applied for plasma discharging. A reactive gas $O_2$ was gradually introduced through the introduction port 19 up to 4.0 sccm. With the drum kept cooled and rotated, an RF power of 100 W was applied to the drum, and $Al_2O_3$ was deposited on a PEN film to be a thickness of 50 nm, thereby forming an inorganic film I3.

(Formation of Inorganic Film I4)

An apparatus of FIG. 4 was used. Al was used as the target. A process gas Ar was introduced through the introduction port 19 at 2.0 sccm, and a cathode power 1000 W was applied for plasma discharging. In this, the discharge voltage in the absence of a reactive gas $O_2$ was 100%, and the discharge voltage in the presence of the reactive gas at 10.0 sccm was 0%. The data were fed back to the mass flow controller so as to keep a discharge voltage of 85% under automatic control, and a reactive gas $O_2$ was introduced through the introduction port 19. With the drum kept cooled and rotated, an RF power of 100 W was applied to the drum, and $Al_2O_3$ was deposited on a PEN film to be a thickness of 50 nm, thereby forming an inorganic film I4.

(Formation of Inorganic Film I5)

An apparatus of FIG. 5 was used. Al was used as the target. A process gas Ar was introduced through the introduction port 19 at 2.0 sccm, and a cathode power 1000 W was applied for plasma discharging. A reactive gas $O_2$ was gradually introduced through the introduction port 19 up to 4.0 sccm. With the drum kept cooled and rotated, an RF power of 100 W was applied to the drum, and $Al_2O_3$ was deposited on a PEN film, as conveyed in a roll-to-roll mode, to be a thickness of 50 nm thereby forming an inorganic film I5.

(Formation of Inorganic Film I6)

Figure 6:
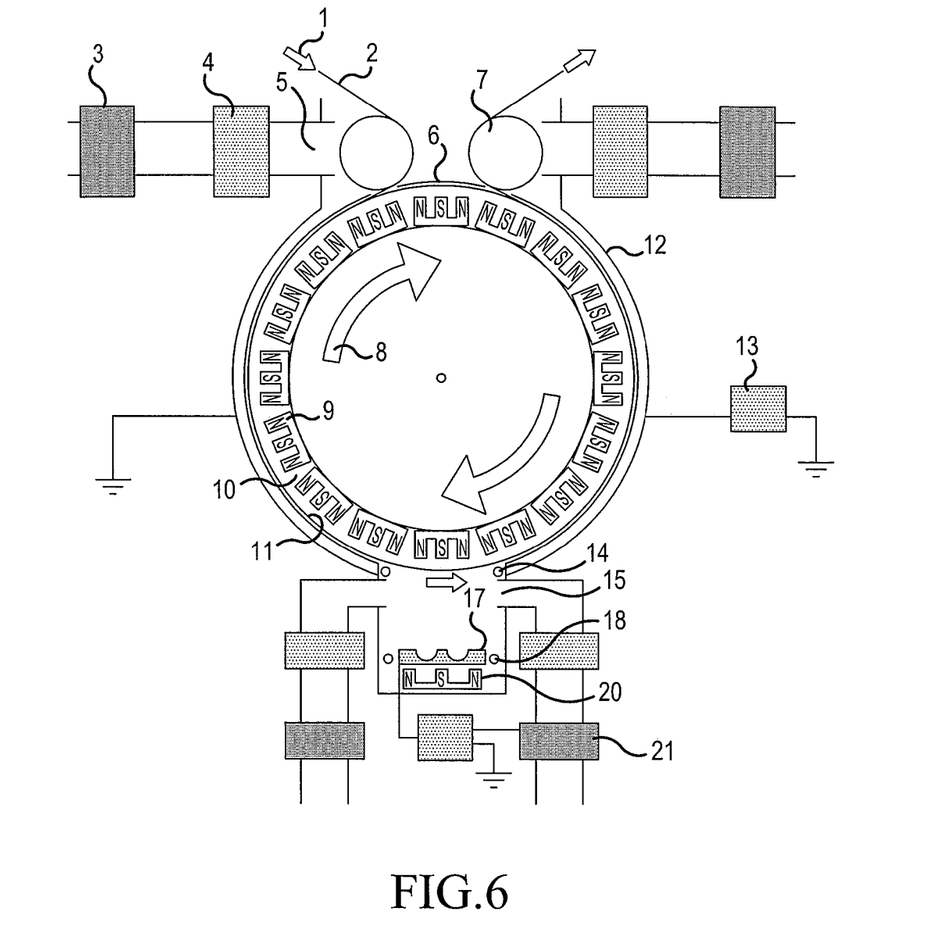
FIG. 6 is a schematic view showing a third example of the reactive sputtering apparatus of the invention.

An apparatus of FIG. 6 was used. Al was used as the target. A process gas Ar was introduced through the introduction port 18 at 2.0 sccm, and a cathode power 1000 W was applied for plasma discharging. A reactive gas $O_2$ was gradually introduced through the introduction port 14 up to 4.0 sccm. With the drum kept cooled and rotated, an RF power of 100 W was applied to the drum, and $Al_2O_3$ was deposited on a PEN film, as conveyed in a roll-to-roll mode, to be a thickness of 50 nm thereby forming an inorganic film I6.

(Formation of Inorganic Film I7)

An apparatus of FIG. 1 was used. Al was used as the target. A process gas Ar was introduced through the introduction port 18 at 2.0 sccm, and a cathode power 1000 W was applied for plasma discharging. A mesh 16 having a degree of opening of 95% was inserted between the target and the substrate, and a reactive gas $O_2$ was gradually introduced through the introduction port 14 up to 4.5 sccm. With the drum kept cooled and rotated, an RF power of 100 W was applied to the drum, and $Al_2O_3$ was deposited on a PEN film, as conveyed in a roll-to-roll mode, to be a thickness of 50 nm thereby forming an inorganic film I7.

(Formation of Inorganic Film I8)

An apparatus of FIG. 1 was used. Al was used as the target. A process gas Ar was introduced through the introduction port 18 at 2.0 sccm, and a cathode power 1000 W was applied for plasma discharging. A mesh 16 having a degree of opening of 95% was inserted between the target and the substrate. In this, the discharge voltage in the absence of a reactive gas $O_2$ was 0%, and the discharge voltage in the presence of the reactive gas at 10.0 sccm was 100%. The data were fed back to the mass flow controller so as to keep a discharge voltage of 85% under automatic control, and a reactive gas $O_2$ was introduced through the introduction port 18. With the drum kept cooled and rotated, an RF power of 100 W was applied to the drum, and $Al_2O_3$ was deposited on a PEN film, as conveyed in a roll-to-roll mode, to be a thickness of 50 nm thereby forming an inorganic film I8.

(Determination of Film Composition and Surface Roughness)

(1) Determination of Film Composition:

Using KRATOS Anlytical's "ESCA3400", all the above-mentioned films were analyzed for ESCA with etching by 5 nm. The mean values at 5 nm, 10 nm and 15 nm from the surface are shown.

(2) Determination of Surface Roughness:

SII Nanotechnology's AFM apparatus, "SPI13800N/SPA400" was used. SI-DF20 was used as the cantilever. Regarding the test condition, the frequency was 1 Hz, and the number of X and Y data were 256 lines. The surface roughness (Ra) within 1 μm square of all the above-mentioned films was measured, and Ra is shown.

Physical properties of the inorganic films analyzed in the above are shown in Table 1. Based on the composition (O/Al), it is known that the inorganic films formed according to the above film formation methods all have a stoichiometric compound composition, and this means that a sufficient reaction occurred in every sample. Regarding the discharge voltage on the substrate on which an inorganic film is formed, it is known that the discharge voltage for the inorganic films I1 to I4, which were formed in the absence of magnets on the back of the substrate, was 354 V and was high, whereas the discharge voltage for the inorganic films I5 to I8, which were formed in the presence of magnets on the back of the substrate, was 76 V or 52 V, and was low. From this, it is obvious that the magnets provided on the back of the substrate obviously lower the voltage in film formation, and with that, the surface roughness Ra of the formed film was lowered. Accordingly, it may be said that dense films with little damage are formed. The inorganic film I2 formed according to an ordinary high-speed reactive sputtering method has a metal-mode film formation speed 0.53. As compared with the inorganic film I2, the film formation speed of the inorganic films I5 to I7 of the invention was all high. Further, the inorganic films I5 to I8 were formed in a continuous roll-to-roll mode process. From the above, the advantages of the invention are obvious that, irrespective of the power source and the chamber to be used, the invention enables continuous film formation with little damage at a high film formation speed.

TABLE 1

| Inorganic Film | Film Formation Speed (nm/min) | Speed Ratio to Al Film Formation | Substrate Discharge Voltage (V) | Surface Roughness Ra (nm) | Composition (O/Al) | Remarks |
|---|---|---|---|---|---|---|
| I1 | 412 | — | 0 | 7.8 | — | Comparative Example |
| I2 | 218 | 0.53 | 0 | 3.9 | 1.59 | Comparative Example |
| I3 | 255 | 0.62 | 354 | 5.2 | 1.49 | Comparative Example |
| I4 | 309 | 0.75 | 362 | 2.5 | 1.54 | Comparative Example |
| I5 | 301 | 0.73 | 76 | 0.9 | 1.52 | Example |
| I6 | 325 | 0.79 | 76 | 0.9 | 1.48 | Example |
| I7 | 334 | 0.81 | 52 | 0.4 | 1.51 | Example |
| I8 | 350 | 0.85 | 52 | 0.3 | 1.53 | Example |

Effect of the Invention

The reactive sputtering method of the invention has made it possible to minimize the damage to the film formed in the method even though the film formation speed is high. Further, the reactive sputtering apparatus of the invention enables continuous film formation.

The present disclosure relates to the subject matter contained in Japanese Patent Application No. 321611/2007 filed on Dec. 13, 2007, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A reactive sputtering method for application of a bias voltage to a supporting substrate in formation of a film of a metal compound on the supporting substrate according to a bias sputtering method;

wherein a supporting substrate conveyor unit and a cathode that includes a target facing the supporting substrate conveyor unit are provided, and the supporting substrate is conveyed between the supporting substrate conveyor unit and the target for formation of a film of a metal compound on the supporting substrate, magnets are provided adjacent to the supporting substrate conveyor unit on a side thereof opposite to that of the supporting substrate, such that a magnetic field is closed and a continuing tunnel part of parallel or nearly parallel arched magnetic force lines forms an oval or a polygon on, the supporting substrate, the magnets each having a first magnetic pole of an S pole or an N pole and a second magnetic pole opposite to the first magnetic pole, the second magnetic pole surrounding the first magnetic pole and, in film formation on the supporting substrate, the magnets are rotated inside a drum in an opposite direction from that in which the supporting substrate is conveyed outside of the drum, so as to secure uniform plasma application along the supporting substrate.

2. The reactive sputtering method of claim 1;
wherein a process gas is introduced through a first port near the target and a reactive gas is introduced through a second port near the supporting substrate.

3. The reactive sputtering method of claim 2;
wherein the process gas is a rare gas and the reactive gas is oxygen, nitrogen, methane or water.

4. The reactive sputtering method of claim 1;
wherein the target is surrounded with an earthed rectangular metal plate box and a mesh plate that is parallel to and in between the target and the supporting substrate.

5. The reactive sputtering method of claim 4;
wherein the mesh plate has a degree of opening that is at least 50%.

6. The reactive sputtering method of claim 2;
wherein for the reactive gas, flow rate data are fed back to an automatic control system to secure constant discharge voltage, plasma emission intensity or inner pressure.

7. The reactive sputtering method of claim 1;
wherein the supporting substrate conveyor unit is driven according to a roll-to-roll system with the drum.

8. The reactive sputtering method of claim 1;
wherein the target is made of one or more materials selected from the group consisting of Mg, Al, Si, Ti, Zn, W, Mo, Ge and Sb.

9. The reactive sputtering method of claim 1;
wherein the supporting substrate is a Si wafer, a glass substrate or a resin substrate.

* * * * *